United States Patent
Fritz et al.

(10) Patent No.: US 12,249,478 B2
(45) Date of Patent: Mar. 11, 2025

(54) PARTICLE BEAM SYSTEM FOR AZIMUTHAL DEFLECTION OF INDIVIDUAL PARTICLE BEAMS AND METHOD FOR AZIMUTH CORRECTION IN A PARTICLE BEAM SYSTEM

(71) Applicant: Carl Zeiss MultiSEM GmbH, Oberkochen (DE)

(72) Inventors: Hans Fritz, Grabs (CH); András G. Major, Oberkochen (DE); Dirk Zeidler, Oberkochen (DE); Arne Thoma, Heidenheim (DE); Joerg Jacobi, Herbrechtingen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 394 days.

(21) Appl. No.: 17/546,952

(22) Filed: Dec. 9, 2021

(65) Prior Publication Data
US 2022/0102104 A1 Mar. 31, 2022

Related U.S. Application Data

(63) Continuation of application No. PCT/DE2020/000100, filed on May 20, 2020.

(30) Foreign Application Priority Data

Jun. 13, 2019 (DE) .......................... 102019004124.0

(51) Int. Cl.
*H01J 37/147* (2006.01)
*H01J 37/09* (2006.01)
*H01J 37/28* (2006.01)

(52) U.S. Cl.
CPC .......... *H01J 37/1475* (2013.01); *H01J 37/09* (2013.01); *H01J 37/28* (2013.01); *H01J 2237/0453* (2013.01); *H01J 2237/152* (2013.01)

(58) Field of Classification Search
CPC ........ H01J 37/1475; H01J 37/09; H01J 37/28; H01J 2237/0453; H01J 2237/152;
(Continued)

(56) References Cited

U.S. PATENT DOCUMENTS 4,130,761 A 12/1978 Matsuda
4,153,843 A 5/1979 Pease
(Continued)

FOREIGN PATENT DOCUMENTS

CN 107003624 A 8/2017
CN 108807119 A 11/2018
(Continued)

OTHER PUBLICATIONS

Wikipedia contributors. (May 21, 2019). Permeability (electromagnetism). In Wikipedia, The Free Encyclopedia. Retrieved 19:33, Mar. 29, 2024, from https://en.wikipedia.org/w/index.php?title=Permeability_(electromagnetism)&oldid=898086042 (Year: 2019).*
(Continued)

*Primary Examiner* — David E Smith
*Assistant Examiner* — Christopher J Gassen
(74) *Attorney, Agent, or Firm* — Fish & Richardson P.C.

(57) ABSTRACT

A particle beam system includes a multi-beam particle source and a magnetic multi-deflector array. The magnetic multi-deflector array includes a coil that is arranged such that, during use of the particle beam system, a multiplicity of individual particle beams substantially passes through the first coil so that they are deflected in an azimuthal direction to correct an azimuthal telecentricity error of the particle (Continued)

beam system so that the individual particle beams telecentrically impinge on an object plane of the particle beam system.

25 Claims, 9 Drawing Sheets

(58) Field of Classification Search
CPC ....... H01J 2237/1035; H01J 2237/1415; H01J 37/1471; H01J 2237/1501; H01J 2237/1505; H01J 2237/151; H01J 2237/2817
See application file for complete search history.

(56) References Cited

U.S. PATENT DOCUMENTS

| | | |
|---|---|---|
| 4,200,794 A | 4/1980 | Newberry |
| 4,338,548 A | 7/1982 | Bono |
| 4,742,234 A | 5/1988 | Feldman |
| 5,215,623 A | 6/1993 | Takahashi |
| 5,864,142 A | 1/1999 | Muraki |
| 5,892,224 A | 4/1999 | Nakasuji |
| 5,905,267 A | 5/1999 | Muraki |
| 5,981,954 A | 11/1999 | Muraki |
| 6,107,636 A | 8/2000 | Muraki |
| 6,124,599 A | 9/2000 | Muraki |
| 6,137,113 A | 10/2000 | Muraki |
| 6,323,499 B1 | 11/2001 | Muraki |
| 6,333,508 B1 | 12/2001 | Katsap |
| 6,617,595 B1 | 9/2003 | Okunuki |
| 6,633,366 B2 | 10/2003 | De Jager |
| 6,696,371 B2 | 2/2004 | Butschke |
| 6,787,780 B2 | 9/2004 | Hamaguchi |
| 6,804,288 B2 | 10/2004 | Haraguchi |
| 6,818,911 B2 | 11/2004 | Tamamori |
| 6,835,508 B2 | 12/2004 | Butschke |
| 6,872,950 B2 | 3/2005 | Shimada |
| 6,903,345 B2 | 6/2005 | Ono |
| 6,903,353 B2 | 6/2005 | Muraki |
| 6,917,045 B2 | 7/2005 | Hashimoto |
| 6,919,574 B2 | 7/2005 | Hashimoto |
| 6,943,349 B2 | 9/2005 | Adamec |
| 6,953,938 B2 | 10/2005 | Iwasaki |
| 6,992,290 B2 | 1/2006 | Watanabe |
| 7,005,658 B2 | 2/2006 | Muraki |
| 7,015,467 B2 | 3/2006 | Maldonado |
| 7,060,984 B2 | 6/2006 | Nagae |
| 7,084,411 B2 | 8/2006 | Lammer-Pachlinger |
| 7,091,504 B2 | 8/2006 | Wieland |
| 7,109,494 B2 | 9/2006 | Ono |
| 7,126,141 B2 | 10/2006 | Ono |
| 7,129,502 B2 | 10/2006 | Kruit |
| 7,244,949 B2 | 7/2007 | Knippelmeyer |
| 7,285,779 B2 | 10/2007 | Litman |
| 7,375,326 B2 | 5/2008 | Sender |
| 7,420,164 B2 | 9/2008 | Nakasuji |
| 7,468,507 B2 | 12/2008 | Rogers |
| 7,504,622 B2 | 3/2009 | Elyasaf |
| 7,535,001 B2 | 5/2009 | Sender |
| 7,601,972 B2 | 10/2009 | Nakasuji |
| 7,619,203 B2 | 11/2009 | Elyasaf |
| 7,696,497 B2 | 4/2010 | Rogers |
| 8,035,082 B2 | 10/2011 | Yamazaki |
| 8,134,135 B2 | 3/2012 | Kruit |
| 8,350,214 B2 | 1/2013 | Otaki |
| 8,362,425 B2 | 1/2013 | Han |
| 8,384,051 B2 | 2/2013 | Ozawa |
| 8,598,525 B2 | 12/2013 | Zeidler |
| 8,618,496 B2 | 12/2013 | Wieland |
| 8,704,192 B2 | 4/2014 | Sano |
| 8,748,842 B2 | 6/2014 | Ohashi |
| 8,779,399 B2 | 7/2014 | Yamanaka |
| 8,829,465 B2 | 9/2014 | Tsunoda |
| 8,963,099 B2 | 2/2015 | Yamada |
| 9,153,413 B2 | 10/2015 | Almogy |
| 9,263,233 B2 | 2/2016 | Zeidler |
| 9,336,981 B2 | 5/2016 | Knippelmeyer |
| 9,336,982 B2 | 5/2016 | Zeidler |
| 9,349,571 B2 | 5/2016 | Kemen |
| 9,368,314 B2 | 6/2016 | Nakasuji |
| 9,530,613 B2 | 12/2016 | Rogers |
| 9,536,702 B2 | 1/2017 | Lang |
| 9,607,805 B2 | 3/2017 | Liu |
| 9,653,254 B2 | 5/2017 | Zeidler |
| 9,666,406 B1 | 5/2017 | Lanio |
| 9,702,983 B2 | 7/2017 | Eder |
| 9,922,799 B2 | 3/2018 | Li |
| 9,991,089 B2 | 6/2018 | Mueller |
| 10,062,541 B2 | 8/2018 | Ren |
| 10,141,160 B2 | 11/2018 | Ren |
| 10,354,831 B2 | 7/2019 | Kemen |
| 10,388,487 B2 | 8/2019 | Zeidler |
| 10,535,494 B2 | 1/2020 | Zeidler |
| 10,541,112 B2 | 1/2020 | Schubert |
| 10,586,677 B1 | 3/2020 | Okada |
| 10,600,613 B2 | 3/2020 | Zeidler |
| 10,622,184 B2 | 4/2020 | Knippelmeyer |
| 10,643,820 B2 | 5/2020 | Ren |
| 10,741,355 B1 | 8/2020 | Zeidler |
| 10,811,215 B2 | 10/2020 | Zeidler |
| 10,854,423 B2 | 12/2020 | Sarov |
| 10,879,031 B2 | 12/2020 | Ren |
| 10,896,800 B2 | 1/2021 | Riedesel |
| 2003/0183773 A1 | 10/2003 | Haraguchi |
| 2008/0149833 A1 | 6/2008 | Endoh et al. |
| 2009/0014649 A1 | 1/2009 | Nakasuji |
| 2012/0037813 A1 | 2/2012 | Lanio |
| 2012/0261573 A1 | 10/2012 | Adamec |
| 2014/0197325 A1 | 7/2014 | Kato |
| 2014/0264062 A1 | 9/2014 | Adamec |
| 2016/0042924 A1* | 2/2016 | Kim ................. C23C 14/083 |
| | | 29/428 |
| 2017/0133198 A1 | 5/2017 | Kruit |
| 2018/0158642 A1 | 6/2018 | Frosien et al. |
| 2019/0088440 A1 | 3/2019 | Zeidler et al. |
| 2019/0131107 A1 | 5/2019 | Tamaki et al. |
| 2019/0333732 A1 | 10/2019 | Ren |
| 2020/0211810 A1 | 7/2020 | Zeidler |
| 2020/0243300 A1 | 7/2020 | Zeidler |
| 2020/0373116 A1 | 11/2020 | Zeidler |
| 2021/0005423 A1 | 1/2021 | Zeidler |
| 2021/0035773 A1 | 2/2021 | Zeidler |

FOREIGN PATENT DOCUMENTS

| | | | |
|---|---|---|---|
| DE | 102014008083 B9 * | 3/2018 | ............. H01J 37/09 |
| GB | 2519511 A | 4/2015 | |
| GB | 2521819 A | 7/2015 | |
| JP | 59184524 A | 10/1984 | |
| JP | 60042825 A | 3/1985 | |
| JP | 60105229 A | 6/1985 | |
| JP | 61263217 A | 11/1986 | |
| JP | 2002-175968 A | 6/2002 | |
| JP | 2003-332207 A | 11/2003 | |
| JP | 2013-030276 A | 2/2013 | |
| JP | 2014-007013 A | 1/2014 | |
| JP | 2014229481 A | 12/2014 | |
| JP | 2016-219292 A | 12/2016 | |
| JP | 2017-007013 A | 1/2017 | |
| TW | I 488212 | 6/2015 | |
| TW | 201833968 A | 9/2018 | |
| TW | I 657475 | 4/2019 | |
| WO | WO02067286 A2 | 8/2002 | |
| WO | WO 2005/024881 A2 | 3/2005 | |
| WO | WO 2007/028595 A2 | 3/2007 | |
| WO | WO2013032949 A1 | 3/2013 | |
| WO | WO2016145458 A1 | 9/2016 | |
| WO | WO 2018/122176 | 7/2018 | |
| WO | WO2020057678 A1 | 3/2020 | |
| WO | WO2020064035 A1 | 4/2020 | |
| WO | WO2020065094 A1 | 4/2020 | |

(56) References Cited

FOREIGN PATENT DOCUMENTS

| | | |
|---|---|---|
| WO | WO2020070074 A1 | 4/2020 |
| WO | WO2020151904 A2 | 7/2020 |
| WO | WO2020249147 A1 | 12/2020 |

OTHER PUBLICATIONS

Chinese Office Action and Search Report, with translation thereof, for corresponding CN Appl No. 202080042737.3, dated Aug. 29, 2023.
Japanese Office Action, with translation thereof, for corresponding JP Appl No. 2021-573553, dated May 23, 2023.
Japanese Office Action, with translation thereof, for corresponding JP Appl No. 2021-573553, dated Nov. 29, 2022.
Translation of International Search Report for PCT Appl No. PCT/DE2020/000100, dated Oct. 20, 2020.

* cited by examiner

PARTICLE BEAM SYSTEM FOR AZIMUTHAL DEFLECTION OF INDIVIDUAL PARTICLE BEAMS AND METHOD FOR AZIMUTH CORRECTION IN A PARTICLE BEAM SYSTEM

CROSS-REFERENCE TO RELATED APPLICATIONS

The present application is a continuation of, and claims benefit under 35 USC 120 to, international application PCT/DE2020/000100, filed May 20, 2020, which claims benefit under 35 USC 119 of German Application No. 10 2019 004 124.0, filed Jun. 13, 2019. The entire disclosure of these applications are incorporated by reference herein.

FIELD

The disclosure relates to particle beam systems which operate with a multiplicity of particle beams.

BACKGROUND

Just like single-beam particle microscopes, multi-beam particle microscopes can be used to analyse objects on a microscopic scale. Images of an object that represent a surface of the object, for example, can be recorded using these particle microscopes. In this way, for example the structure of the surface can be analysed. While in a single-beam particle microscope an individual particle beam of charged particles, such as electrons, positrons, muons or ions, is used to analyse the object, in a multi-beam particle microscope, a multiplicity of particle beams are used for this purpose. The multiplicity of the particle beams, also referred to as a bundle, are directed onto the surface of the object at the same time, as a result of which a significantly larger area of the surface of the object can be scanned and analysed as compared with a single-beam particle microscope within the same period of time.

WO 2005/024 881 A2 discloses a multiple particle beam system in the form of an electron microscopy system which operates with a multiplicity of electron beams in order to scan an object to be examined using a bundle of electron beams in parallel. The bundle of electron beams is generated by an electron beam generated by an electron source being directed onto a multi-aperture plate having a multiplicity of openings. One portion of the electrons of the electron beam is incident on the multi-aperture plate and is absorbed there, and another portion of the beam passes through the openings in the multi-aperture plate, such that an electron beam is shaped in the beam path downstream of each opening, the cross section of the electron beam being defined by the cross section of the opening. Furthermore, suitably chosen electric fields provided in the beam path upstream and/or downstream of the multi-aperture plate have the effect that each opening in the multi-aperture plate acts as a lens on the electron beam passing through the opening, such that the electron beams are focused in a plane situated at a distance from the multi-aperture plate. The plane in which the foci of the electron beams are formed is imaged by a downstream optical unit onto the surface of the object to be examined, such that the individual electron beams are incident on the object in a focused manner as primary beams. There they generate interaction products, such as backscattered electrons or secondary electrons, emanating from the object, which are shaped to form secondary beams and are directed onto a detector by a further optical unit. There each of the secondary beams is incident on a separate detector element such that the electron intensities detected by the detector element provide information relating to the object at the site at which the corresponding primary beam is incident on the object. The bundle of primary beams is scanned systematically over the surface of the object in order to generate an electron micrograph of the object in the manner that is customary for scanning electron microscopes.

In the multiple particle beam system described, a high resolution and a high throughput are highly relevant for the satisfactory and successful use in practice. It can be desirable to largely reduce various types of imaging aberrations that occur.

Frequently, a telecentric incidence of the particle beams on the object to be examined is desired in particle beam systems. The individual particle beams can then in each case be incident orthogonally on the sample. This can result in recordings of very good quality can be achieved even in the case of greatly structured objects.

However, it is exactly the telecentricity condition that it is sometimes difficult to implement in the case of objects that are situated within a magnetic field. In practice, a magnetic immersion lens can be used as the objective lens such that a magnetic field strength of typically more than 20 mT occurs at the image plane. Angle deviations or azimuthal deviations then can take on a particular meaning. Consequently, it would be desirable to correspondingly correct azimuthal deviations.

US 2003/0183773 A1 discloses a magnetic field generating mechanism that can be used in principle for azimuthal deflection. It proposes for this purpose an electromagnetic coil array, wherein one or more coils that generate a magnetic field in the orthogonal direction with respect to the movement direction of the particle beams are arranged on the walls within the openings in the array. Using inhomogeneous quadrupole fields, it is possible in principle to correct astigmatism, and azimuthal deflection of individual particle beams is possible in principle. However, the proposed magnetic field generating mechanism with the electromagnetic coil array can be difficult to produce since it involves many lines and insulating measures.

SUMMARY

The present disclosure seeks to provide a particle beam system that permits easy setting of azimuth angles in the particle beam system individually for all individual particle beams.

The inventors have investigated the occurrence of azimuthal deflections in magnetic fields and performed extensive calculations and simulations in this regard. One of the things realized is that radial and azimuthal telecentricity errors in magnetic immersion lenses are substantially proportional to the distance of the individual particle beam from the optical axis. A reasonable correction should thus be able to correspondingly compensate for this type of error.

A result of the disclosure is a simple and elegant possibility of performing a desired azimuthal deflection using few or using only one parameter in a manner that is nevertheless individually suitable for each individual particle beam. According to an embodiment of the disclosure, this is accomplished by specific field shaping of a magnetic field by way of which the charged particles of the particle beams enter a nearly abruptly changing magnetic field or exit a nearly abruptly decreasing magnetic field. To explain this illustratively, owing to the entry into the abruptly changing magnetic field, the magnetic component of a generalized angular momentum changes abruptly, as it were. Upon exit from the magnetic field, by contrast, the magnetic component is once again zero and is converted into a kinetic angular momentum owing to the law of conservation. In other words, the kinetic angular momentum of the charged particles upon entry into the magnetic field is different from the one upon exit from the magnetic field. This change in the kinetic angular momentum corresponds to an azimuthal deflection.

An aspect of the disclosure relates to a particle beam system including the following:
- a multi-beam particle source configured to generate a multiplicity of charged individual particle beams; and
- a magnetic multi-deflector array for deflecting the individual particle beams in the azimuthal direction, including:
  - a magnetically conductive multi-aperture plate having a multiplicity of openings, which is arranged in the beam path of the particle beams such that different ones of the individual particle beams substantially pass through different openings in the multi-aperture plate;
  - a magnetically conductive first aperture plate having an individual opening, which first aperture plate is arranged in the beam path of the particle beams such that a multiplicity of the individual particle beams substantially pass through the individual opening in the first aperture plate;
  - wherein the multi-aperture plate and the first aperture plate are connected to each other such that a cavity is formed between the two plates; and
  - a first coil for generating a magnetic field, which coil is arranged in the cavity between the multi-aperture plate and the first aperture plate such that the multiplicity of the individual particle beams substantially pass through the coil.

According to the disclosure, at least one particle source is provided, although it is also possible for a plurality of particle sources to be provided. The charged particles can be for example electrons, positrons, muons or ions or other charged particles. The charged particles can be electrons generated, for example, using a thermal field emission source (TFE). However, other particle sources can also be used.

A feature of the disclosure is the magnetic multi-deflector array for deflecting the individual particle beams in the azimuthal direction. This permits the aforementioned specific field shaping. In this case, the magnetically conductive multi-aperture plate and the magnetically conductive first aperture plate can in principle be understood to be the upper and lower pole shoe of a magnetic lens, that allow the magnetic field lines of the coil or winding to exit, or distribute them, in a defined shape. According to an embodiment, the multiplicity of the openings in the multi-aperture plate and the individual larger opening in the first aperture plate substantially represent the only openings in the pole shoes. That means that, except for the openings in the multi-aperture plate and the individual opening in the first aperture plate, the cavity formed between the multi-aperture plate and the first aperture plate is completely closed. The coil is situated on the inner side walls of the cavity. All the individual particle beams pass through the windings of the coil. The scalar magnetic field strength in the region of the individual larger opening in the first aperture plate is substantially rotationally symmetric with respect to the optical axis of the system. This is not the case in the region of the small openings for the individual particle beams in the multi-aperture plate: Here, the rotational symmetry in the region of the openings is broken and, when the charged particles pass through the openings, an abrupt change in the magnetic field strength or in the magnetic flux occurs.

According to an embodiment of the disclosure, the multi-aperture plate and the first aperture plate are electrically insulated from each other. The cavity formed between the two plates is then in effect not closed substantially completely but can have for example an encircling gap. In other words, the upper and the lower pole shoe of the multi-deflector array are insulated from each other and it is then possible to generate, in addition to the magnetic field, an electric field, too, by applying different voltages to the two plates or pole shoes. The electric field thus generated acts as a multi-lens array.

According to an embodiment of the disclosure, the multi-aperture plate is arranged in the beam path of the charged particles upstream of the first aperture plate. In this case, the charged particles undergo a jump in the magnetic flux upon entry into the magnetic multi-deflector array.

According to an embodiment of the disclosure, the multi-aperture plate is arranged in the beam path of the individual particle beams downstream of the first aperture plate. In this case, the jump mentioned occurs upon exiting the magnetic multi-deflector array.

According to an embodiment of the disclosure, the multi-deflector array furthermore includes the following:
- a magnetically conductive second aperture plate having an individual opening, which second aperture plate is arranged in the beam path of the particles such that the multiplicity of individual particle beams substantially pass through the individual opening in the second aperture plate;
- wherein the multi-aperture plate and the second aperture plate are connected to each other such that a second cavity is formed between the two plates; and
- a second coil for generating a magnetic field, which coil is arranged in the second cavity between the multi-aperture plate and the second aperture plate such that the multiplicity of individual particle beams substantially pass through the second coil,
- wherein the winding direction of the second coil runs counter to the winding direction of the first coil.

In this embodiment of the disclosure, the magnetic multi-deflector array can substantially undergo symmetrization. The multi-aperture plate can be situated centrally within the multi-deflector array, as a result of which less strong forces now act on the multi-aperture plate. The design of the multi-deflector array that has thus been symmetrized therefore has certain constructive desirable properties. However, as before, the sudden change in the magnetic flux that the individual particle beams experience still occurs upon passage through the multi-aperture plate. In addition, it is important that the winding directions of both coils run counter to each other in order to shape the desired magnetic field. The winding direction of the coils is here indicated in each case in the direction of the technical current flow. Reversing the current direction in a coil—without constructive changes of the windings—thus also corresponds to a reversal of the winding direction. Besides, the upper part of the multi-deflector array can be absolutely equal constructively to the lower region of the multi-deflector array.

According to an embodiment of the disclosure, the magnetic permeability $\mu_r$ of at least one of the plates and/or at least one magnetically conductive coating of the plates of the multi-deflector array is: $\mu_r \geq 500$, such as $\mu_r \geq 2000$, $\mu_r \geq 5000$, and/or $\mu_r \geq 10\,000$. This high magnetic permeability permits good shaping of the magnetic field in the multi-deflector array. All the plates and/or all the magnetically conductive coatings of the plates of the multi-deflector array can have the highest possible magnetic permeability $\mu_r$. This is true both for the multi-aperture plate and for the first and possibly the second aperture plates. In addition, this can also be true for the wall regions of the multi-deflector array or for the connecting pieces between the multi-aperture plate and the single aperture plate or the single aperture plates.

According to an embodiment of the disclosure, at least one of the plates of the multi-deflector array includes at least one of the following materials: iron, nickel, cobalt, ferrite, mu-metal, nanocrystalline metal. These materials have very high magnetic permeabilities $\mu_r$. The materials can also take the form of a coating of the plates.

According to an embodiment embodiment of the disclosure, the thickness of at least one of the magnetic plates or of a magnetically conductive coating of the multi-deflector array is at least 30 μm. Thin layers or plates have a low conductivity for the magnetic flux, for example because the magnetic saturation is already achieved for small magnetic field strengths. Therefore, somewhat larger plate thicknesses are preferably used. Alternatively, a non-magnetic carrier plate, e.g. made from silicon, can be used, on which then a magnetically conductive layer is applied at a corresponding thickness. For the desired magnetic field strength in the multi-deflector array, the magnetic saturation is typically no longer reached from plate thicknesses or layer thicknesses of 30 μm.

According to an embodiment of the disclosure, the openings in the multi-aperture plate and/or the aperture plate are circular. All the openings through which the individual particle beams pass can be circular. This thus applies not only to the openings in the multi-aperture plate, but also to the individual opening in the first aperture plate and also to the opening in the second aperture plate, if the latter is provided. The geometry of the openings can have an influence on the magnetic field shaping. In some cases, circular openings can permit the best possible implementation of the desired field shape.

According to an embodiment of the disclosure, the diameter d of the openings in the multi-aperture plate is: $d \leq 150$ μm, such as $d \leq 50$ μm and/or $d \leq 10$ μm.

In principle, the opening diameter d is sufficiently large for the individual particle beams to pass through the respective opening without collisions. The individual particle beams are thus not shaped by the multi-aperture plate per se, but the multiplicity of individual particle beams are already formed beforehand. Conversely, the attainable local abrupt change in the magnetic field succeeds the better the smaller the chosen diameter d of the openings is. It can therefore be likewise desirable to position the multi-aperture plate in an intermediate image, because here the beam cross sections of the individual particle beams are minimal and therefore the diameters of the openings in the multi-aperture plate can have a smaller design without notably trimming the particle beams.

According to an embodiment of the disclosure, the arrangement of the openings in the multi-aperture plate is hexagonal. This means that the individual particle beams can be arranged in accordance with a hexagonal structure for example with 61 or 91 individual particle beams (in accordance with the general formula $3n(n-1)+1$, with n being a natural number) and this arrangement is then geometrically also provided in the multi-aperture plate.

In one embodiment, it is also possible in the case of the hexagonal arrangement for the optical axis of the particle beam system to pass centrally through one of the openings in the multi-aperture plate. This can be advantageous for beam correction for geometric reasons.

Furthermore, the optical axis of the particle beam system can in an embodiment pass centrally through the individual opening in the first aperture plate. If a second aperture plate is also provided, as described above, the optical axis of the particle beam system can likewise extend centrally through the individual opening in the second aperture plate.

According to an embodiment of the disclosure, the strength of the magnetic field generated by the at least one coil is settable, and/or the magnetic field strength B is: $B \leq 0.1$ mT, $B \leq 1.0$ mT and/or $B \leq 5$ mT. It is possible to vary the current through the coil such that any magnetic field strengths in the intervals 0 to 0.1 mT, 0 to 1 mT or 0 to 5 mT are settable. If only one coil is present, the magnetic field is determined only by the magnetic field of that one coil. If two coils are present, both a first aperture plate and a second aperture plate are thus present, and as a result, the magnetic field can be set by way of the two coils. The current through both coils can in this case be the same, with the result that the respective magnetic fields have the same size but are oriented counter to one another. The settability of the current or of the magnetic field generated by the coil has the result that the desired azimuthal deflection can be set in a targeted manner. A strong magnetic field here means strong azimuthal deflections, while a weak magnetic field means weak azimuthal deflections. Typical azimuthal deflection angles β which should be settable are: $0 \leq \beta \leq 0.1$ mrad, $0 \leq \beta \leq 1$ mrad, and/or $0 \leq \beta \leq 5$ mrad.

According to an embodiment of the disclosure, the particle beam system furthermore includes the following:
  a multi-coil array adapted to locally individually set a magnetic field near the openings of the multi-aperture plate,
  wherein the multi-coil array is arranged outside the cavity of the magnetic multi-deflector array such that the individual particle beams pass through the coils of the multi-coil array. For example, it is possible that the multi-coil array is arranged outside on the multi-aperture plate. What is important is that the coils are here not seated within the multi-aperture plate or within the openings, but in fact outside the multi-aperture plate or outside the multi-deflector array. In this way, no impairment upon entry and/or exit of the individual particle beams into and/or out of the multi-deflector array takes place. Rather, the multi-coil array, if used, allows individual post-adjustment (pre-adjustment) or post-correction (pre-correction) of the azimuthal deflection. In principle, the azimuthal deflection continues to be performed in the multi-deflector array; the multi-coil array serves merely for any potential fine adjustment of the azimuthal deflection per individual particle beam. The magnetic field strengths of the individual coils of the multi-coil array can accordingly also be set individually.

An aspect of the disclosure relates to a particle beam system including the following:
  a multi-beam particle source configured to generate a multiplicity of charged individual particle beams; and
  an azimuth deflector for deflecting the individual particle beams in the azimuthal direction, including a mechanism to generate a time-variable magnetic field that, in turn, generates electric vortex fields in the azimuthal direction. This embodiment of the disclosure thus is again based on the fact that a field that makes deflection of the individual particle beams in the azimuthal direction possible is generated in a very targeted manner. In this embodiment, this is an electric field that is present in the form of an electric vortex field and is generated by the temporal variation of a magnetic field.

The mechanism for generating a time-variable magnetic field can include a coil having an axis that coincides with the optical axis of the particle beam system, and which is arranged such that the individual particle beams pass through the coil. The windings of the coil thus enclose all the individual particle beams of the particle beam system.

It is possible to set the strength of the electric vortex fields in the azimuthal direction by way of the temporal variation of the magnetic field. If the temporal variation is constant, constant electric vortex fields can be generated. For practical aspects, the temporal variation of a magnetic field cannot be continued in an unlimited manner; rather, the magnetic field in practice will reach its maximum strength at some point. It therefore makes sense according to an embodiment of the disclosure to adapt the temporal variation of the magnetic field to a scanning interval of the particle beam system. This makes it possible for the individual particle beams to encounter the same electric vortex field for every scanning process.

An aspect of the disclosure relates to the use of the particle beam system in an embodiment, as described above, for telecentricity correction of individual particle beams on a sample that is situated in a magnetic field. In this case, the individual particle beams can be corrected individually in each case with respect to their azimuthal deviations. For example, the use mentioned relates to a telecentricity correction in cases in which a magnetic immersion lens is used as the objective lens, that is to say in which it is the case that the individual particle beams, on account of the magnetic field in the region of the sample, would not be incident on the sample orthogonally, but at a specific angle. This rotation or tilting of the individual particle beams can be corrected using the described particle beam system by way of a corresponding deflection in the azimuthal direction.

An aspect of the disclosure relates to a method for azimuth correction in a particle beam system, for example, although not only, by using a particle beam system as described above in several embodiments, which includes the following steps:
a multiplicity of charged particle beams impinging on a sample;
ascertaining angles of incidence of the individual particle beams on the sample;
ascertaining deviations of the angles of incidence from predefined angles of incidence;
dividing the deviations into radial and azimuthal components;
correcting the azimuthal components of the deviations for the individual particle beams by way of electric and/or magnetic deflection fields.

For ascertaining the angles of incidence of the individual particle beams, for example at least two images can be recorded, in the case of otherwise identical beam guidance, at different Z-positions of the stage, that is to say at different distances of an object from the objective of the particle beam system. The two images can be compared to each other, and the angles of incidence can be calculated from the displacements of the image contents observed during the comparison.

For ascertaining the deviations and for dividing the respective deviations into a radial component and an azimuthal component and for subsequently correcting the azimuthal components of the deviations, a computer program can be employed. Dividing into a radial component and an azimuthal component is important because the two deviations can be correspondingly corrected using different deflectors or correctors. The azimuthal components of the deviations from the defined or desirable optimum angles of incidence can be corrected for example by way of the above-described particle beam systems according to the disclosure. However, it is also possible in principle to use other particle beam systems already known from the prior art for the method according to the disclosure.

Radial components, in addition to the azimuthal components, of the deviations for the individual particle beams can also be corrected by way of electric and/or magnetic deflection fields. This radial correction can be performed by way of other correction devices or deflectors than the azimuthal correction. Radial corrections can be achieved for example using rotationally symmetric magnetic lenses, which act globally on all individual beams. Alternatively, it is possible to radially deflect the individual beams individually with an electrostatic multi-deflector array.

Correcting the azimuthal components can include calculating an excitation of a magnetic multi-deflector array and the generation of the calculated excitation. In other words, it is ascertained what current flow through the first and/or second coil in the multi-deflector array for the desired azimuthal deflection is to be generated. Alternatively, the correcting the azimuthal components can include calculating a temporal magnetic field variation in an azimuth deflector and generating the calculated magnetic field variation.

According to an embodiment, correcting radial components includes calculating excitations of electromagnetic lenses for radial correction and generating the calculated excitations.

According to an embodiment, the predetermined angles of incidence correspond to telecentric illumination of the object. Telecentric illumination or telecentric irradiation is desirable for example in the case of highly structured objects to obtain the best possible image results.

Alternatively, the predetermined angles of incidence correspond to an illumination or irradiation through the coma-free point of an objective lens. In this case, it is possible that significantly fewer image aberrations occur.

The above-described exemplary embodiments of the disclosure can be combined wholly or partly with one another, provided that no technical contradictions arise as a result.

BRIEF DESCRIPTION OF THE DRAWINGS

The disclosure will be understood even better with reference to the accompanying figures. In the figures.

DESCRIPTION OF EXEMPLARY EMBODIMENTS

Figure 1:
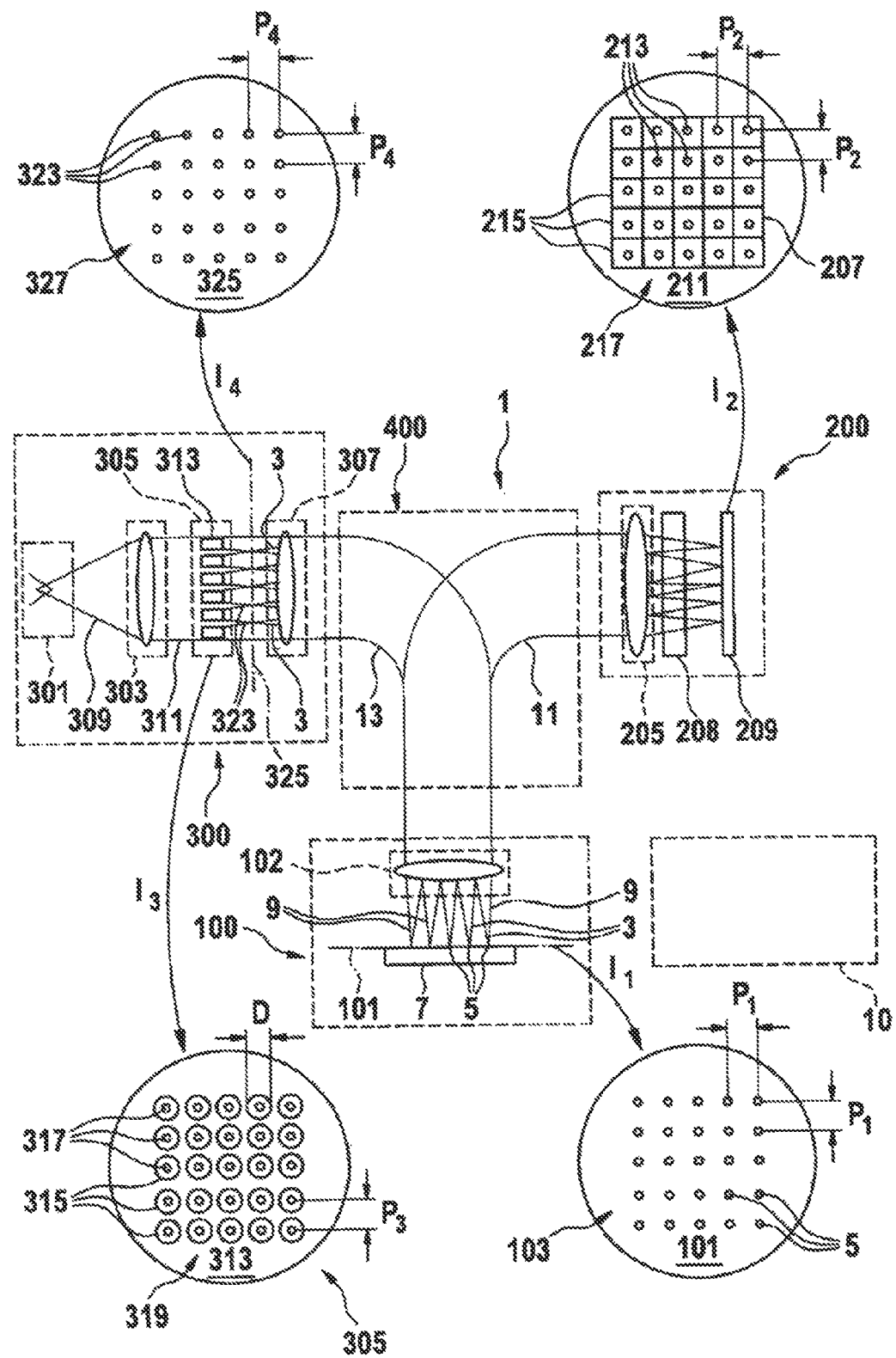
FIG. 1 shows a multi-beam particle microscope in a schematic illustration.

FIG. 1 is a schematic illustration of a particle beam system 1 in the form of a multi-beam particle microscope 1, which uses a multiplicity of particle beams. The particle beam system 1 generates a multiplicity of particle beams which impinge on an object to be examined in order to generate there interaction products, e.g. secondary electrons, which emanate from the object and are subsequently detected. The particle beam system 1 is of the scanning electron microscope (SEM) type, which uses a plurality of primary particle beams 3 which impinge on a surface of the object 7 at a plurality of locations 5 and generate there a plurality of electron beam spots, or spots, that are spatially separated from one another. The object 7 to be examined can be of any desired type, e.g. a semiconductor wafer or a biological sample, and include an arrangement of miniaturized elements or the like. The surface of the object 7 is arranged in a first plane 101 (object plane) of an objective lens 102 of an objective lens system 100.

The enlarged detail $I_1$ in FIG. 1 shows a plan view of the object plane 101 having a regular rectangular field 103 of sites of incidence 5 formed in the first plane 101. In FIG. 1, the number of sites of incidence is 25, which form a 5×5 field 103. The number 25 of sites of incidence is a number chosen for reasons of simplified illustration. In practice, the number of beams and accordingly of sites of incidence can be chosen to be significantly greater, such as, for example, 20×30, 100×100 and the like.

In the embodiment illustrated, the field 103 of sites of incidence 5 is a substantially regular rectangular field having a constant distance $P_1$ between adjacent sites of incidence. Exemplary values of the distance $P_1$ are 1 micrometre, 10 micrometres and 40 micrometres. However, it is also possible for the field 103 to have other symmetries, such as a hexagonal symmetry, for example.

A diameter of the beam spots shaped in the first plane 101 can be small. Exemplary values of the diameter are 1 nanometre, 5 nanometres, 10 nanometres, 100 nanometres and 200 nanometres. The focusing of the particle beams 3 for shaping the beam spots 5 is carried out by the objective lens system 100.

The primary particles incident on the object generate interaction products, e.g. secondary electrons, back-scattered electrons or primary particles that have experienced a reversal of movement for other reasons, which emanate from the surface of the object 7 or from the first plane 101. The interaction products emanating from the surface of the object 7 are shaped by the objective lens 102 to form secondary particle beams 9. The particle beam system 1 provides a particle beam path 11 for guiding the multiplicity of secondary particle beams 9 to a detector system 200. The detector system 200 includes a particle optical unit having a projection lens 205 for directing the secondary particle beams 9 onto a particle multi-detector 209.

The detail $I_2$ in FIG. 1 shows a plan view of the plane 211, in which individual detection regions of the particle multi-detector 209 on which the secondary particle beams 9 are incident at the sites 213 are located. The sites of incidence 213 lie in a field 217 with a regular distance $P_2$ with respect to one another. Exemplary values of the distance $P_2$ are 10 micrometres, 100 micrometres and 200 micrometres.

The primary particle beams 3 are generated in a beam generating device 300 including at least one particle source 301 (e.g. an electron source), at least one collimation lens 303, a multi-aperture arrangement 305 and a field lens 307. The particle source 301 generates a diverging particle beam 309, which is collimated or at least substantially collimated by the collimation lens 303 in order to shape a beam 311 which illuminates the multi-aperture arrangement 305.

The detail 13 in FIG. 1 shows a plan view of the multi-aperture arrangement 305. The multi-aperture arrangement 305 includes a multi-aperture plate 313, which has a plurality of openings or apertures 315 formed therein. Midpoints 317 of the openings 315 are arranged in a field 319 that is imaged onto the field 103 formed by the beam spots 5 in the object plane 101. A distance $P_3$ between the midpoints 317 of the apertures 315 can have exemplary values of 5 micrometres, 100 micrometres and 200 micrometres. The diameters D of the apertures 315 are smaller than the distance $P_3$ between the midpoints of the apertures. Examples of values of the diameters D are $0.2 \times P_3$, $0.4 \times P_3$ and $0.8 \times P_3$.

Particles of the illuminating particle beam 311 pass through the apertures 315 and form particle beams 3. Particles of the illuminating beam 311 which are incident on the plate 313 are absorbed by the latter and do not contribute to the formation of the particle beams 3.

On account of an applied electrostatic field, the multi-aperture arrangement 305 focuses each of the particle beams 3 in such a way that beam foci 323 are formed in a plane 325. Alternatively, the beam foci 323 can be virtual. A diameter of the beam foci 323 can be for example 10 nanometres, 100 nanometres and 1 micrometre.

The field lens 307 and the objective lens 102 provide a first imaging particle optical unit for imaging the plane 325, in which the beam foci 323 are formed, onto the first plane 101 such that a field 103 of sites of incidence 5 or beam spots is produced there. If a surface of the object 7 is arranged in the first plane, the beam spots are correspondingly formed on the object surface.

The objective lens 102 and the projection lens arrangement 205 provide a second imaging particle optical unit for imaging the first plane 101 onto the detection plane 211. The objective lens 102 is thus a lens which is part of both the first and the second particle optical unit, while the field lens 307 belongs only to the first particle optical unit and the projection lens 205 belongs only to the second particle optical unit.

A beam switch 400 is arranged in the beam path of the first particle optical unit between the multi-aperture arrangement 305 and the objective lens system 100. The beam switch 400 is also part of the second optical unit in the beam path between the objective lens system 100 and the detector system 200.

Further information relating to such multi-beam particle beam systems and components used therein, such as, for instance, particle sources, multi-aperture plate and lenses, can be obtained from the international patent applications WO 2005/024881, WO 2007/028595, WO 2007/028596, WO 2011/124352 and WO 2007/060017 and the German patent applications having the application numbers DE 10 2013 026 113.4 and DE 10 2013 014 976.2, the disclosure of which in the full scope thereof is incorporated by reference in the present application.

The multi-beam particle beam system furthermore includes a computer system 10 configured both for controlling the individual particle optical components of the multi-beam particle beam system and for evaluating and analysing the signals obtained by the multi-detector 209. In this case, the computer system 10 can be constructed from a plurality of individual computers or components.

The magnetic multi-deflector array 500 according to the disclosure or the azimuth deflector 600 according to the disclosure can now be integrated into the multi-beam particle beam system for deflecting the individual particle beams 3 in the azimuthal direction. This makes sense for example for example if the objective lens 102 is situated very close to the object 7 and the objective lens 102 is embodied as a magnetic immersion lens. This is because in that case, an inadvertent azimuthal deflection of the individual particle beams 3 occurs in the magnetic field of the objective lens 102. This can be compensated for by a targeted azimuth deflection according to the disclosure.

Figure 2:
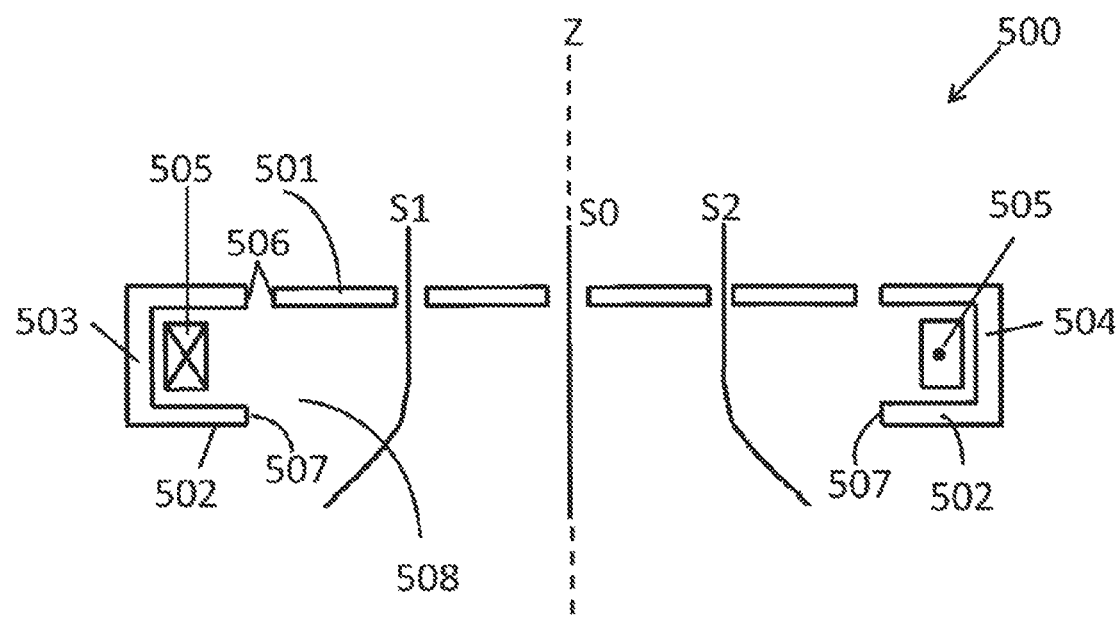
FIG. 2 shows a schematic section illustration through a magnetic multi-deflector array.

FIG. 2 shows a schematic section illustration through a magnetic multi-deflector array 500. The magnetic multi-deflector array 500 includes a magnetically conductive multi-aperture plate 501 and a magnetically conductive first aperture plate 502. The multi-aperture plate 501 has a multiplicity of circular openings 506 and is arranged in the beam path of the particles such that the individual particle beams substantially pass through the openings 506 of the multi-aperture plate 501. The optical axis Z of the particle beam system also extends through an opening 506 of the multi-aperture plate 501. In the example shown, the multi-aperture plate 501 is arranged above or in the beam path of the particle beams upstream of the first aperture plate 502. The first aperture plate 502 has an individual circular opening 507 and is arranged in the beam path of the particles such that all individual particle beams 3, or at least a multiplicity of the individual particle beams, substantially pass through the individual opening of the first aperture plate 502. The optical axis Z of the system here extends through the midpoint of the opening 507 of the first aperture plate 502.

The multi-aperture plate 501 and the first aperture plate 502 are connected to each other via side regions 503, 504 such that a substantially closed cavity 508 is formed between the two plates 501 and 502. A coil 505 is located in the lateral regions of the cavity 508. The winding direction of the coil 505 is indicated in the cross section shown by the cross or the point. The magnetic field lines of the coil in this arrangement are substantially parallel to the optical axis Z. Overall, the example of a magnetic multi-deflector array 500 shown in FIG. 2 has substantially the geometric shape of a flat hollow cylinder. The openings of the cylinder are formed by the openings 506 of the multi-aperture plate 501 and the individual central opening 507 of the first aperture plate 502. Otherwise, there are only openings for line connections (not illustrated).

The multi-aperture plate 501 and the first aperture plate 502 including the connecting side regions 503 and 504 are formed in each case from a material having a high magnetic permeability $\mu_r$. The plates 501 and 502 including the side regions 503 and 504 are can be made here from the same material. Examples of materials are, for example, iron, nickel, cobalt, ferrite, mu-metal or nanocrystalline metal or alloys of the aforementioned materials. The thickness of the plates 501, 502 and of the side regions 503 and 504 in the example shown is at least approx. 30 μm. With a correspondingly high magnetic permeability $\mu_r$, the thickness of the plates 501, 502 is sufficient to avoid magnetic saturation for the desired magnetic field strengths. Alternatively, it is possible for the multi-aperture plate 501 and the first aperture plate 502 including the connecting side regions 503 and 504 to be formed in each case from a non-magnetic carrier plate, e.g. made from silicon, on which a magnetic layer made from one of the aforementioned materials is applied with the corresponding thickness of at least 30 μm. Typical maximum magnetic field strengths of the magnetic field generated by the coil 505 lie between about 0.1 mT and 5 mT, e.g. are 1 mT. The strength of the magnetic field generated by the coil 505 is settable here.

The openings 506 of the multi-aperture plate 501 are arranged such that the individual particle beams 3 can pass through the openings 506. Their geometric arrangement is thus adapted to the geometry of the used individual particle beams 3 of the system. The opening arrangement in the multi-aperture plate 501 can be hexagonal, according to the formula 3n (n−1)+1, with n being a natural number.

The individual particle beams 3 thus pass through the magnetic multi-deflector array 500 thus described. FIG. 2 illustrates by way of example three beams S0, S1 and S2. The beam S0 moves along the optical axis Z of the system both through the multi-aperture plate 501 and through the single aperture plate 502. It is here not deflected in the magnetic field generated by the coil 505. The two beams S1, S2, by contrast, are incident off-axis on the multi-deflector array 500. Initially, they enter parallel to the optical axis Z into the openings 506 of the multi-aperture plate 501. Then they undergo a deflection in the magnetic field, shown in an exaggerated manner in FIG. 2 for illustrative purposes.

Figure 3:
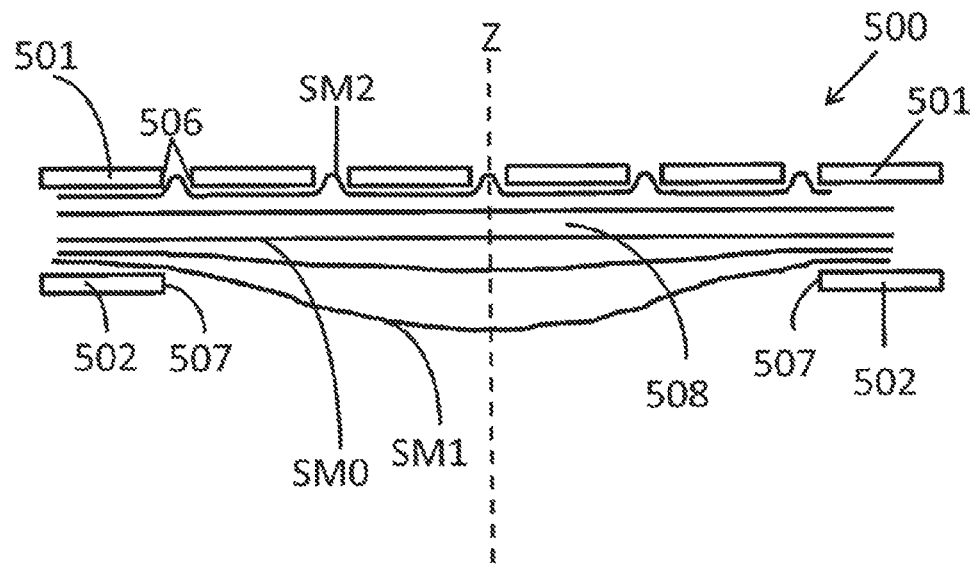
FIG. 3 shows a schematic illustration of the magnetic scalar potential.

FIG. 3 shows a schematic illustration of the magnetic scalar potential. The scalar potential is illustrated in the form of equipotential lines SM0, SM1 and SM2. Within the cavity 508 or at quite a distance from the plates 501 and 502, the scalar potential in a plane perpendicular to the optical axis Z is constant and can be illustrated by SM0 as a straight, horizontal line. In the region of the opening 507 of the first aperture plate 502, the equipotential lines of the scalar potential are slightly curved. This is illustrated schematically by SM1. The equipotential lines of the scalar magnetic potential in the centre of the cavity 508 and through the opening 507 in the first aperture plate 502 are rotationally symmetric about the optical axis Z, because the opening 507 of the first aperture plate 502 is arranged centrally with respect to the optical axis Z, the midpoint or centroid of the opening 507 of the first aperture plate 502 is situated on the optical axis Z.

The situation is different in the region of the multi-aperture plate 501. Here, calculations and simulations show strong curvatures of the equipotential lines of the scalar magnetic potential in the region of each of the openings 506, schematically illustrated by SM2. In the region of the openings 506, these are local regions of a symmetry break. The magnetic scalar potential thus suddenly changes in the region of each of the openings 506. As the individual particle beams 3 pass through the openings 506 of the multi-aperture plate 501, the magnetic flux thereby changes almost abruptly. As all the individual particle beams pass through the openings 506, they pass through the same gradient in the scalar magnetic potential. As the individual particle beams pass through the large opening 507 in the single aperture plate 502, by contrast, they pass through different gradients of the scalar potential.

The effect, on which the azimuthal correction is based, can then be described in illustrative terms as follows: Due to the abrupt change in the magnetic flux, a magnetic component of a generalized angular momentum is supplied to the individual particle beams 3. This generalized angular momentum has a magnetic and a kinetic component. Upon further passage through the multi-deflector array 500 and when leaving the multi-deflector array 500—without jump—the magnetic component of the angular momentum is converted into a kinetic angular momentum. The change of the kinetic component of the angular momentum corresponds to an azimuthal deflection. The magnitude of this deflection is dependent here on the distance of the individual particle beam 3 from the optical axis Z. The greater the distance of an individual particle beam 3 from the optical axis Z is, the greater is the azimuthal deflection of the beam. Consequently, each individual particle beam 3 is deflected individually in the azimuthal direction for example proportionally to its distance r from the optical axis Z. Nevertheless, no individual setting of a field is used herefor, but the only used magnetic field is generated equally for all the individual particle beams 3 by way of the single coil 505. The geometry of the multi-deflector array or the specific arrangement of the multi-aperture plate 501 and the first aperture plate 502 and the use of correspondingly magnetically conductive materials are thus crucial for the effect of the azimuthal deflection. The strength of the deflection can be set via the current flow through the coil 505. Alternatively, the strength of the deflection can be set by way of the distance between the multi-aperture plate 501 and the single aperture plate 502. Although in each case only one parameter is varied, it produces an individual setting of a deflection in the azimuthal direction for each individual particle beam 3 corresponding to the position thereof in relation to the optical axis Z.

Figure 4B:
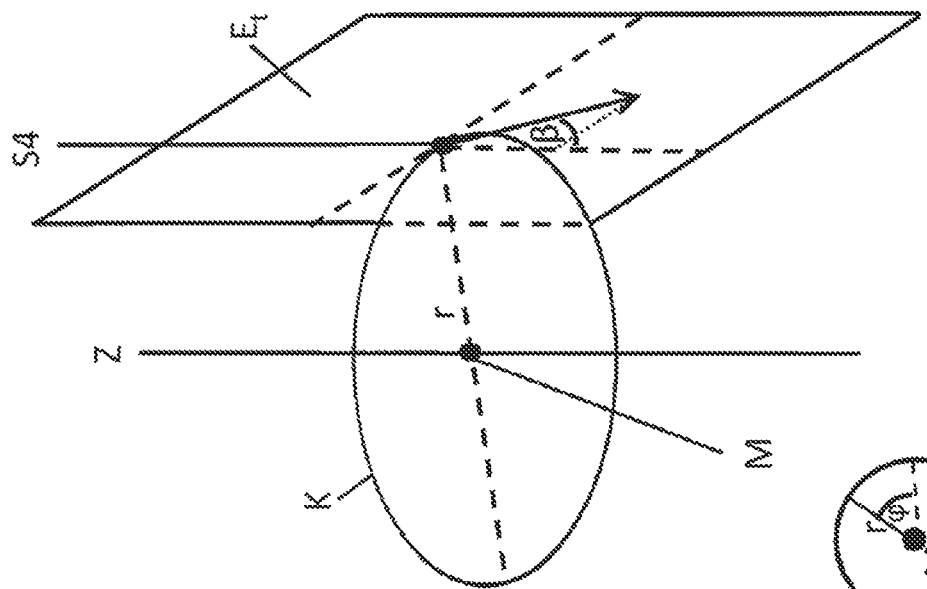
FIGS. 4A-4C schematically illustrate a radial and an azimuthal deflection of an individual particle beam.
Figure 4C:
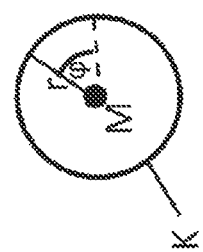
Figure 4A:
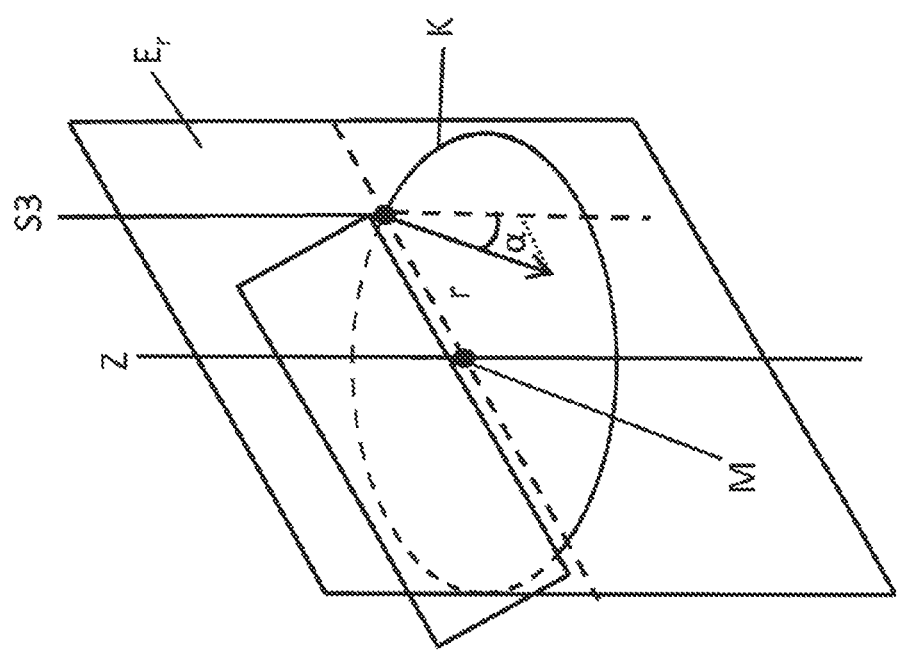

FIG. 4 illustrates a radial and an azimuthal deflection of an individual particle beam. FIG. 4A illustrates a radial deflection of an individual particle beam S3. First, the optical axis Z of the particle beam system is illustrated. S3 is an off-axis beam that is incident in a radial deflection element, indicated by the circle K, parallel to the optical axis Z. The deflection element or the circle K here lies in the plane that is oriented orthogonally to the radial plane $E_r$. The radial plane $E_r$ is defined by the optical axis and the point of intersection of the individual particle beam S3 with the circle K. The deflection of the beam S3 is now such that the beam S3 is still located in the radial plane $E_r$ even after it travels through the deflector K. Overall, it is deflected within the plane $E_r$ by the angle α. This type of deflection within the radial plane $E_r$ represents a radial deflection.

FIG. 4B illustrates by way of example an azimuthal deflection of an individual particle beam S4. Illustrated once again is the optical axis Z of a deflector illustrated by the circle K with the midpoint M. This deflector K can be, for example, the multi-aperture plate 501 of the multi-deflector array according to the disclosure from FIGS. 2 and 3. The azimuthal deflection of the individual particle beam S4 now takes place in the tangential plane $E_t$. The tangential plane $E_t$ is situated here tangentially at the circle K having the radius r. The azimuthal deflection is here relatively small, and the deflected beam S4 therefore still moves approximately within the tangential plane $E_t$ after the completed azimuthal deflection. It is deflected here within the tangential plane $E_t$ by the angle β.

FIG. 4C illustrates once more a radial deflection and an azimuthal deflection in combination using a circle K having the midpoint M in a schematic plan view. A radial deflection here takes place in principle in the direction of the radius r and thus points in the direction of the midpoint M or away from the midpoint M. By contrast, an azimuthal deflection is a deflection in the direction of a horizontal angle φ. The polar coordinates r and φ here should not be confused with the angles of deflection α and β, which refer to the respective deflection within the radial plane $E_r$ and the tangential plane $E_t$.

Figure 5:
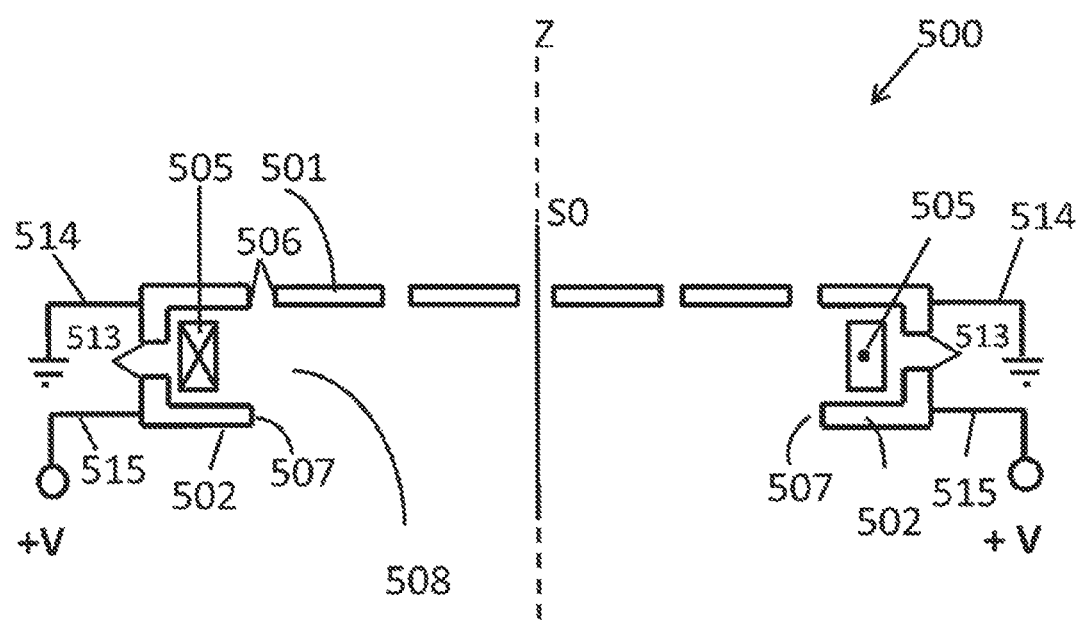
FIG. 5 shows a schematic section illustration through a further magnetic multi-deflector array.

FIG. 5 shows a schematic section illustration through a further magnetic multi-deflector array 500. The reference signs used in FIG. 5 correspond to those already used in FIGS. 2 and 3. However, the embodiment of the multi-deflector array 500 illustrated in FIG. 5 differs, from the exemplary embodiment illustrated in FIGS. 2 and 3 by the fact that the multi-aperture plate 501 and the single (first) aperture plate 502 are electrically insulated from each other. Between the multi-aperture plate 501 and the single aperture plate 502, an encircling gap 513 that electrically insulates the two plates 501 and 502 from each other is located. Alternatively, the gap 513 can be filled with an electrically insulating material. In this embodiment of the disclosure, it is possible to apply different electrical potentials to the multi-aperture plate 501 and the single aperture plate 502. In each case connections 514 and 515 are provided for applying the electrical potentials, i.e. a voltage between the multi-aperture plate 501 and the single aperture plate 502. The gap 513 here also forms a resistance for the magnetic flux. However, if the gap 513 is sufficiently thin, the magnetic field generated by the coil 505 can still be guided sufficiently accurately.

Figure 6:
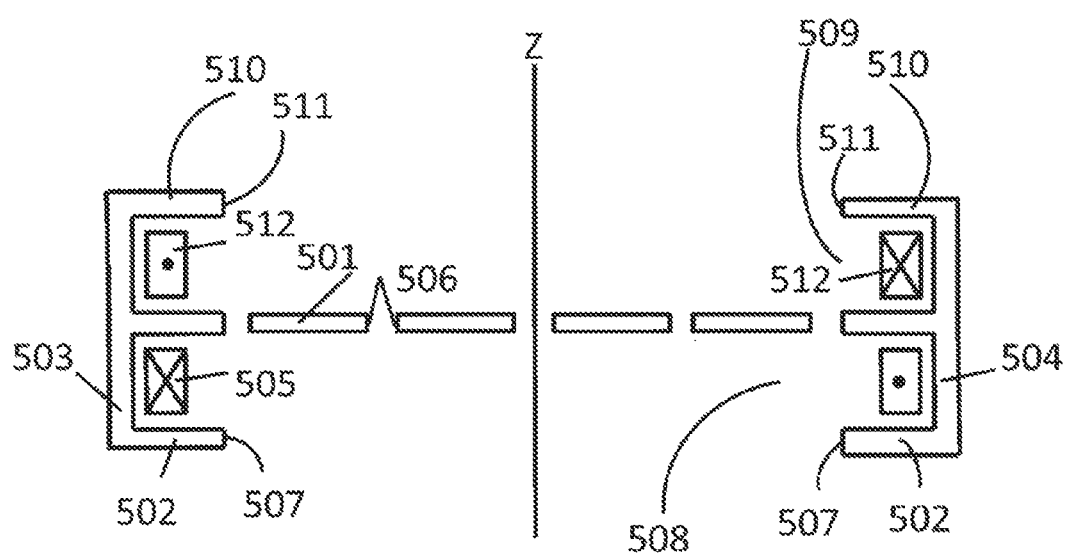
FIG. 6 shows a schematic section illustration through a magnetic multi-deflector array with two aperture plates.

FIG. 6 shows a schematic section illustration through a magnetic multi-deflector array 500 with two aperture plates 502 and 510. The reference signs used in FIG. 6 here correspond to those of FIG. 2. The illustrated arrangement of the magnetic multi-deflector array 500 shows a symmetrized embodiment. The multi-aperture plate 501 is located here centrally in the multi-deflector array 500, i.e. centrally between the first single aperture plate 502 and a second single aperture plate 510. Like the first aperture plate 501, the second magnetically conductive aperture plate 510 likewise has an individual circular opening 511 and is arranged in the beam path of the particle beams 3 such that a multiplicity of individual particle beams 3 substantially pass through both the first aperture plate 502 and the second aperture plate 510. The optical axis Z thus extends centrally both through the individual opening 507 of the first aperture plate 502 and centrally through the individual opening 511 of the second aperture plate 510. A second cavity 509 is formed between the multi-aperture plate 501 and the second aperture plate 510. A second coil 512 is located in this cavity 509. The windings of this second coil 512 are oriented counter to the winding direction of the first coil 505. Owing to the symmetric arrangement of the plates 501, 502 and 510, the same effect of a deflection in the azimuthal direction can be attained as with the arrangement illustrated in FIG. 2. However, owing to the symmetrical design of the multi-deflector array 500, less strong forces act on the multi-aperture plate 501. The actual jump in the scalar magnetic potential or the magnetic flux occurs also in this embodiment upon the passage of the individual particle beams 3 through the openings 506 of the multi-aperture plate 501. The plates 501, 502 and 510 in this exemplary embodiment, too, can be electrically insulated from one another by a gap, and additionally a lens effect can be provided by applying different potentials.

Figure 7:
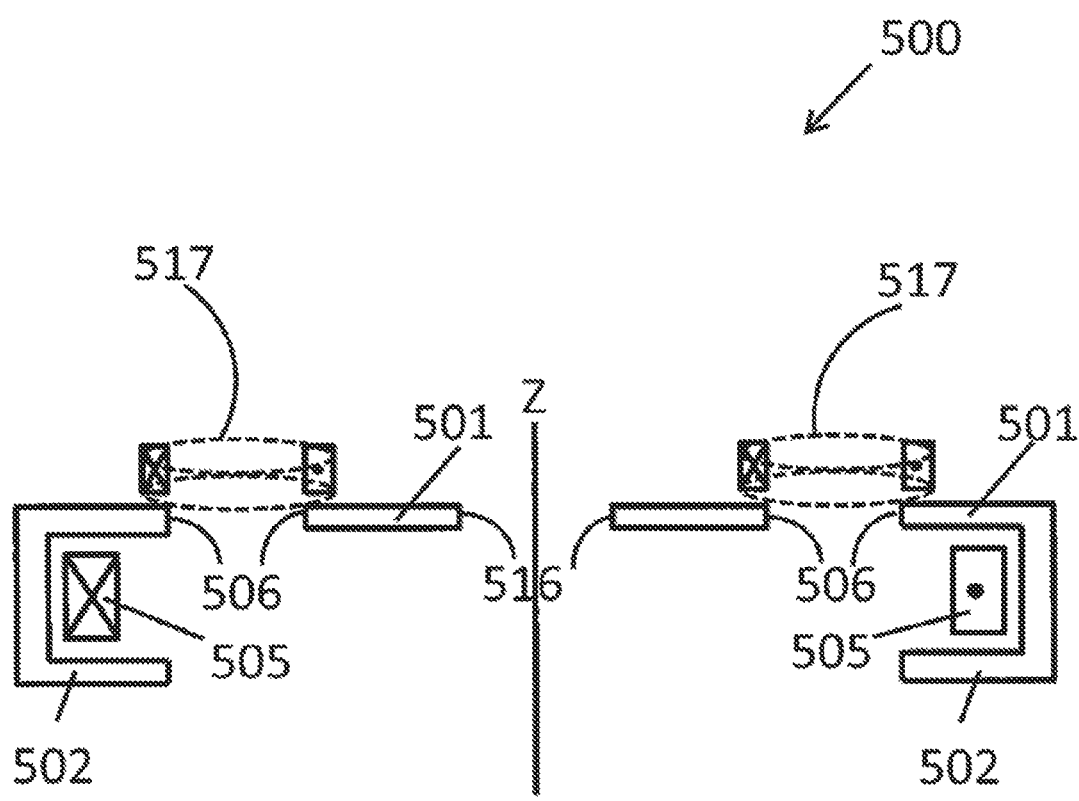
FIG. 7 shows a schematic section illustration through a magnetic multi-deflector array with an additional multi-coil array.

FIG. 7 shows a schematic section illustration through a magnetic multi-deflector array 500 with an additional multi-coil array. In each case one coil 517 is arranged above every (or almost every) opening 506. Each of the coils surrounds one of the openings 506. The coils are not seated within the openings 506. The coils 517 are substantially circular and arranged such that the respective coil axis is parallel to the optical axis Z. Each coil 517 thus surrounds an individual particle beam 3. In this way, individual post-correction may be possible for all openings 506 that are not located on the optical axis Z. Such a post-correction is generally not necessary for a central opening 516 that is located on the optical axis Z, i.e. there is no coil 517 located here in the example shown because the central individual particle beam 3 normally does not have to be corrected in respect of an azimuthal deflection. Alternatively, it is also possible to arrange a coil 517 near the central opening 516. This can help compensate for any weakening of the magnetic flux that individual particle beams may experience upon passage through the multi-aperture plate 501.

Where the above-described exemplary embodiments state that the first and/or the second aperture plate have an individual opening, what is meant is that there is one opening in the first and/or second aperture plate through which a multiplicity of or all individual particle beams that are to be incident on the object and undergo the desired azimuthal deflection pass. However, the effect attained with the disclosure is not disturbed if the first and/or second aperture plate have further openings located outside the region and through which the multiplicity of individual particle beams that are to undergo the desired azimuthal deflection pass or through which other individual particle beams that do not belong to the aforementioned multiplicity pass.

Figure 8:
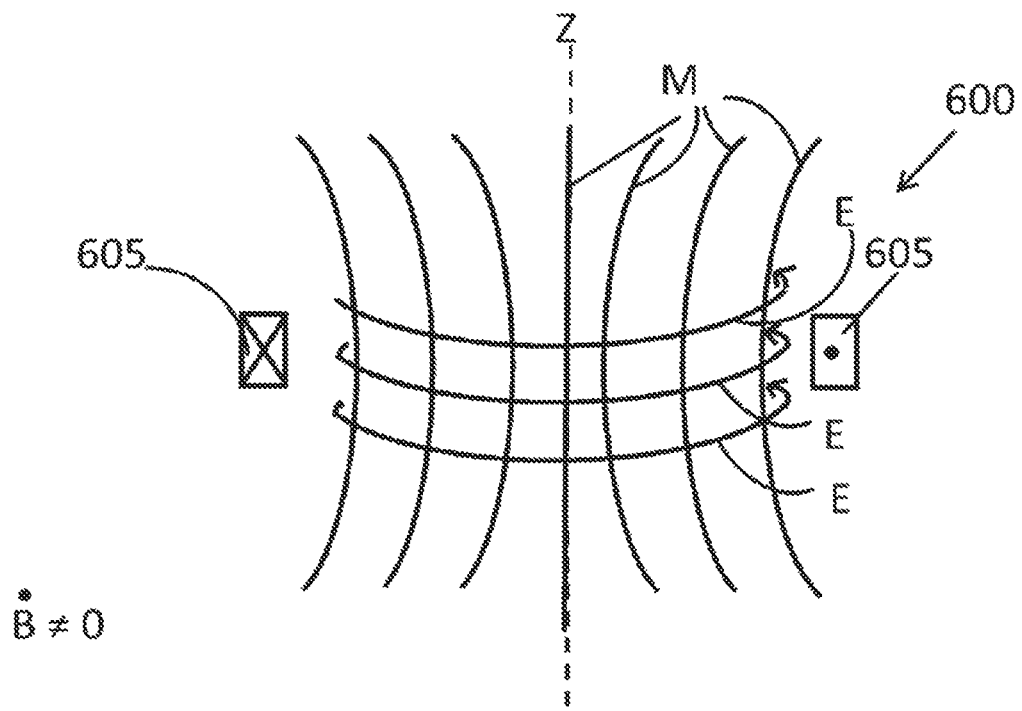
FIG. 8 shows a schematic illustration of an azimuth deflector based on electric vortex fields.

FIG. 8 shows an alternative embodiment of the disclosure. It schematically illustrates an azimuth deflector 600 based on the generation of electric vortex fields. These electric vortex fields permit azimuthal deflection. The electric vortex fields are generated by a time-variable magnetic field. The magnetic field B itself is generated by a coil 605. The windings of this coil 605 are rotationally symmetric and the coil 605 is oriented coaxially with respect to the optical axis Z. The magnetic field lines M are thus substantially parallel to the optical axis Z in the case of the coil 605 through which current flows. If the strength of the magnetic field B now changes over time owing to a time-varying current through the coil 605, an electric vortex field E is generated, which is oriented circularly around the optical axis Z.

Figure 9:
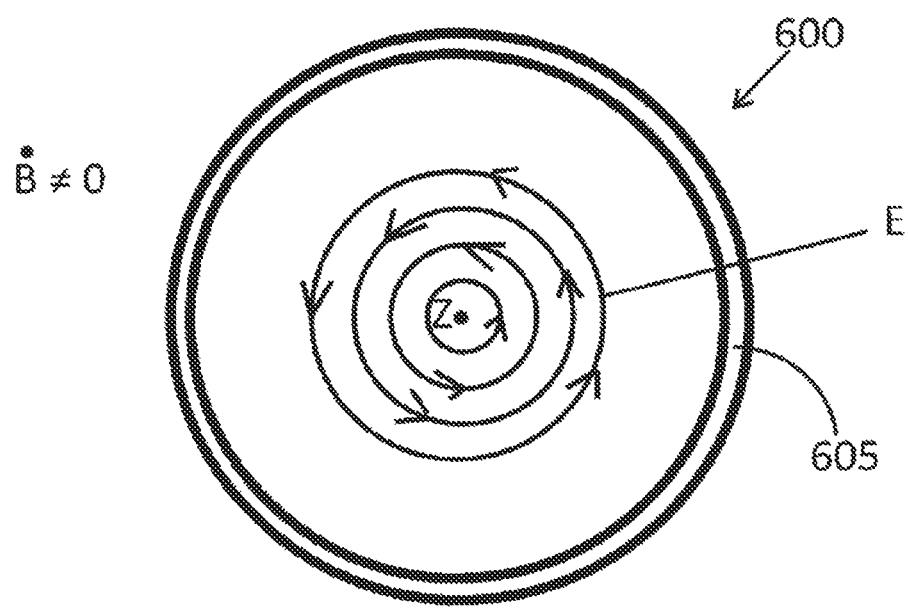
FIG. 9 shows a plan view of the azimuth deflector from FIG. 8.

FIG. 9 shows a corresponding plan view of the azimuth deflector 600 from FIG. 8. The optical axis Z is located in the centre and the coil 605 through which current flows is indicated by two outer circular rings in the diagram. The electric vortex field E extends annularly around the optical axis Z. The individual particle beams 3 are now deflected in the direction of the electric vortex field by the electric field E upon passage through the azimuth deflector 600. In other words, the azimuth angle of the individual particle beams changes. The strength of this deflection depends on how fast the temporal variation of the magnetic field is effected.

Particle beam systems typically irradiate a sample or an object 7 in a scanning manner, which is why it is expedient to adapt a reset for the magnetic field B to a scanning interval of the particle beam system (known as fly-back time). For example, the current through the coil 605 can increase or decrease at a constant rate during each line scan, with the result that a temporally constant rate of variation for the magnetic field is attained during a line scan. During the fly-back, that is to say during the guidance of the particle beams back to the line starts, the current through the coil 605 can then be reset to the initial value. In this way, particle beams in principle always encounter the same electric vortex field.

Figure 10B:
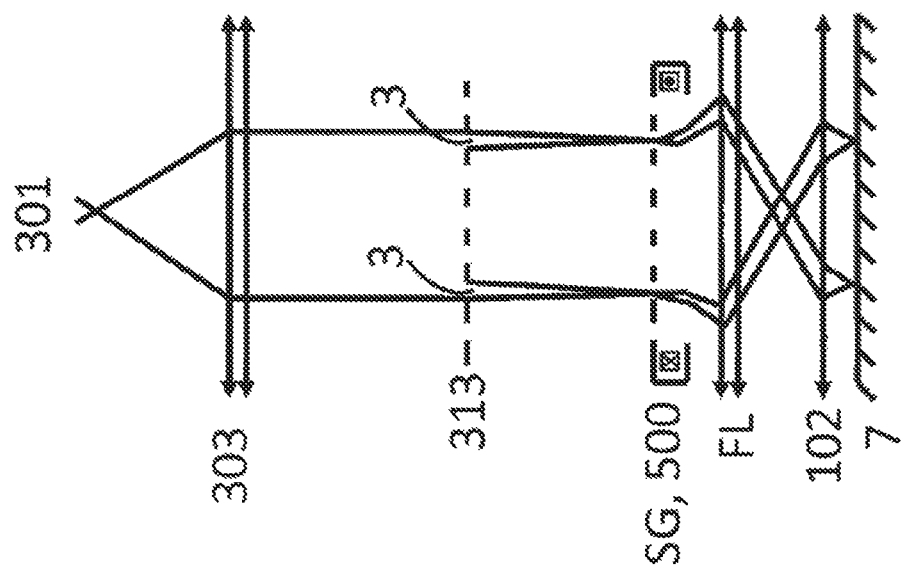
FIGS. 10A-10B show a schematic illustration of the positioning of a magnetic multi-deflector array in a multi-beam particle microscope.
Figure 10A:
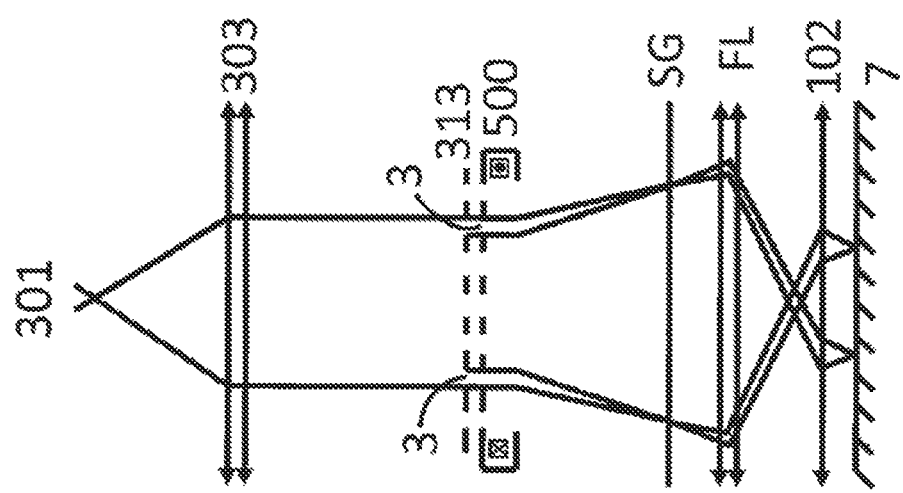

FIGS. 10A-10B show a schematic illustration of the positioning of a magnetic multi-deflector array 500 in a multi-beam particle microscope 1. Analogously, an azimuth deflector 600 based on the generation of electric vortex fields in the azimuthal direction can also be used. The position of the magnetic multi-deflector array 500 is here able to be selected in a largely flexible manner.

In FIG. 10A, the multi-deflector array 500 is arranged near the multi-beam particle source or near a multi-aperture plate 313 forming individual particle beams 3. FIG. 10A concretely shows a particle source 301 (e.g. an electron source) that generates a diverging particle beam 309. The beam 309 passes through a condenser system 303. Next, it is incident on a multi-aperture plate 313, and the individual particle beams 3 are generated. Immediately downstream of the multi-aperture plate 313, the multi-deflector array 500 according to the disclosure is located in the example shown. The beams corrected therein with respect to the azimuthal deflection form, in the further beam path, an intermediate image SG before they pass through a field lens system FL and are finally imaged onto the object 7 through the objective lens 102. The objective lens 102 can be a magnetic immersion lens, so that the object 7 is still located within the magnetic field of the immersion lens 102. The tilt of the individual particle beams 3 owing to the magnetic field of the magnetic immersion lens 102 can be compensated by the deflection in the azimuthal direction within the multi-deflector array 500. The current of the coil of the multi-deflector array 500 is correspondingly set such that the azimuthal deflections of the individual particle beams due to the multi-deflector array 500 substantially compensate the azimuthal deflection of each of the individual particle beams due to the magnetic immersion field.

In the example illustrated in FIG. 10B, the multi-deflector array 500 is located in the region of the intermediate image SG. This allows for the position of the beams 3 on the object 7—unlike in the example according to FIG. 10A)—to be not significantly changed when the set deflection angles change. However, other positionings of the multi-deflector array 500 are also possible in principle.

Figure 11:
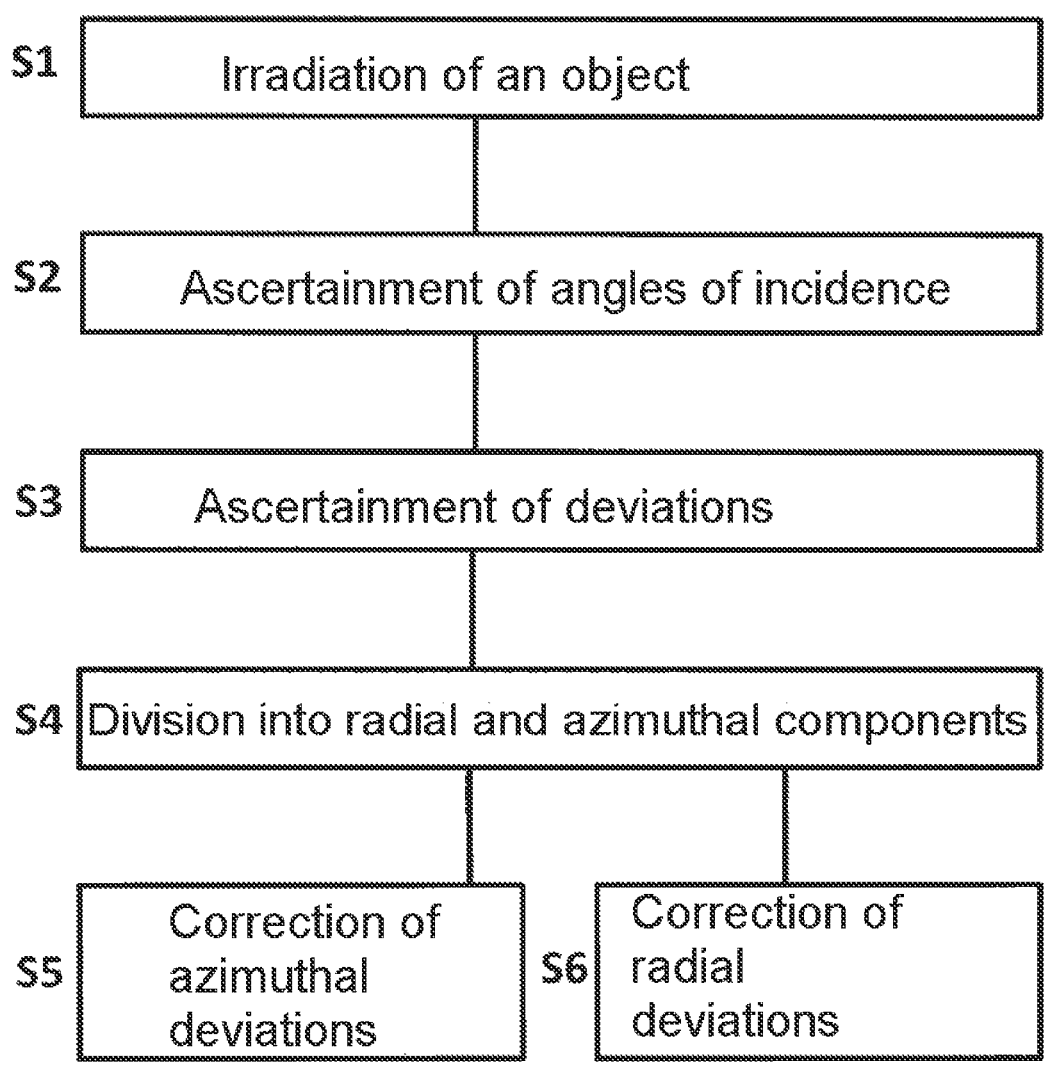
FIG. 11 shows a flowchart of a method for azimuth correction.

FIG. 11 shows a flowchart of a method for azimuth correction. In a first step S1, an object 7 is irradiated. That means that a multiplicity of charged individual particle beams 3 are incident on a sample 7. In a further step S2, a suitable apparatus is used to ascertain the angles of incidence of the individual particle beams 3 onto the sample 7. For ascertaining the angles of incidence of the individual particle beams, for example at least two images of an object can be recorded, in the case of otherwise identical beam guidance, at different distances of the object from the objective lens. The two images can be compared to each other, and the angles of incidence can be calculated from the displacements of the image contents observed during the comparison. For every angle of incidence ascertained, the deviations of the angle of incidence from a defined optimum or otherwise predefined angle of incidence are ascertained in a step S3. These optimum angles of incidence are generally the desired angles that are desirable for the respect imaging. For example, it is possible that the optimum angles of incidence correspond to telecentric illumination, during which the individual particle beams are thus orthogonally incident on the sample. It is also possible that the optimum angles of incidence selected in advance correspond to illumination through the coma-free point of an objective lens.

In a further step S4, the ascertained deviations are divided into radial and azimuthal components. The radial and azimuthal components can then be corrected separately.

Accordingly, the azimuthal deviations are corrected in method step S5 using electrical and/or magnetic deflection fields. Additionally or alternatively, the radial components of the deviations for the individual particle beams can be corrected using electrical and/or magnetic deflection fields in method step S6. The order of the method steps S5 and S6 is arbitrary here, and simultaneous or partially simultaneous correction of the deviations is also possible in principle.

Correcting the azimuthal components in step S5 here includes for example calculating an excitation of a magnetic multi-deflector array 500 and generating the calculated excitation. In other words, it is calculated for example what current flows through the first coil 505 to generate the desired magnetic field that in the multi-aperture plate 501 brings about the desired field jump and/or the desired symmetry break in the magnetic field, which in turn results in the desired deflection in the azimuthal direction. In addition, the current that flows through a second coil 512 can also be determined, if such a second coil 512 is present. It is possible to choose the current level to be identical to the current level in the first coil 505, but wherein the winding direction of the first coil 505 differs from the winding direction of the second coil 512. In addition, the coils 517 of any multi-coil array that may be present can also be calculated and set in terms of their respective current level. Alternatively, a plate distance between the multi-aperture plate 501 and the first single aperture plate 502 and possibly a second single aperture plate 510 can be calculated and set. Values of the parameters used that are to be set in each case can be stored here in look-up tables, the content of which is accessed during the performance of the method according to the disclosure.

Analogously, correcting the radial components of the angle deviations includes calculating excitations of electromagnetic lenses for the radial correction and generating the calculated excitations. Alternatively, the radial corrections can be made with an electrostatic multi-deflector array, and the associated potentials can be calculated and generated.

The described particle beam system with the multi-deflector array 500 according to the disclosure or with the azimuth deflector 600 can be used for the azimuth correction. However, other deflection apparatus that are already known from the prior art permit in principle a correction in the azimuthal and/or radial direction. However, the fact is that the method according to the disclosure can be performed relatively easily and elegantly with the azimuth deflectors 500, 600 according to the disclosure.

What is claimed is:

1. A particle beam system, comprising:
a multi-beam particle source configured to generate a multiplicity of charged individual particle beams; and
a magnetic multi-deflector array:
a magnetically conductive multi-aperture plate comprising a multiplicity of openings, the multi-aperture plate being in a beam path of the individual particle beams so that different individual particle beams substantially pass through different openings in the multi-aperture plate;
a magnetically conductive first aperture plate comprising an individual opening, the first aperture plate being in the beam path of the individual particle beams so that a multiplicity of the individual particle beams substantially pass through the individual opening in the first aperture plate; and
a first coil configured to generate a magnetic field, wherein:
the multi-aperture plate and the first aperture plate are connected to each other to define a first cavity therebetween;
the first cavity comprises an interior and inner sidewalls that define an outer boundary of the interior of the first cavity in a direction perpendicular to an optical axis of the particle beam system; and
the first coil is disposed on the inner sidewalls of the first cavity so that the first coil is rotationally symmetric around an optical axis of the particle beam system;
during use of the particle beam system, the multiplicity of individual particle beams substantially passes through the first coil so that the individual particle beams are deflected in an azimuthal direction to correct an azimuthal telecentricity error of the particle beam system so that the individual particle beams telecentrically impinge on an object plane of the particle beam system.

2. The particle beam system of claim 1, wherein the individual opening in the first aperture plate comprises a midpoint that coincides with an optical axis of the particle beam system.

3. The particle beam system of claim 1, wherein the multi-aperture plate is upstream of the first aperture plate along the beam path of the individual particle beams.

4. The particle beam system of claim 1, wherein the multi-aperture plate is downstream of the first aperture plate along the beam path of the individual particle beams.

5. The particle beam system of claim 1, wherein the multi-deflector array further comprises:
a magnetically conductive second aperture plate comprising an individual opening, the second aperture plate being in the beam path of the individual particle beams so that the individual particle beams substantially pass through the individual opening of the second aperture plate; and
a second coil configured to generate a magnetic field, wherein:
the multi-aperture plate and the second aperture plate are connected to each other to define a second cavity therebetween;
the second coil is in the second cavity so that the individual particle beams substantially pass through the second coil, and
a winding direction of the second coil runs counter to a winding direction of the first coil.

6. The particle beam system of claim 1, wherein at least one of the following holds:
a magnetic permeability of at least one plate selected from the group consisting of the multi-aperture plate and the first aperture plate is at least 500; and
a magnetically conductive coating of at least one plate selected from the group consisting of the multi-aperture plate and the first aperture plate has a magnetic permeability of at least 500.

7. The particle beam system of claim 1, wherein at least one plate selected from the group consisting of the multi-aperture plate and the first aperture plate comprises at least one material selected from the group consisting of iron, nickel, cobalt, ferrite, mu-metal, and nanocrystalline metal.

8. The particle beam system of claim 1, wherein at least one plate selected from the group consisting of the multi-aperture plate and the first aperture plate has a thickness of at least 30 µm.

9. The particle beam system of claim 1, wherein at least one plate selected from the group consisting of the multi-aperture plate and the first aperture plate comprises a coating having a thickness of least 30 μm.

10. The particle beam system of claim 1, wherein at least one of the following holds:
the openings of the multi-aperture plate are circular; and
the individual opening of the first aperture plate is circular.

11. The particle beam system of claim 1, wherein a diameter of the openings in the multi-aperture plate is at most ≤150 μm.

12. The particle beam system of claim 1, wherein an arrangement of the openings in the multi-aperture plate is hexagonal.

13. The particle beam system of claim 1, wherein the first coil is configured to generate a strength of a magnetic field of at most 5 mT.

14. The particle beam system of claim 1, further comprising a multi-coil array configured to locally individually set a magnetic field near the openings of the multi-aperture plate, wherein the multi-coil array is outside the first cavity so that the individual particle beams pass through the coils of the multi-coil array.

15. The particle beam system of claim 1, wherein:
the individual opening in the first aperture plate comprises a midpoint that coincides with an optical axis of the particle beam system; and
the multi-aperture plate is upstream of the first aperture plate along the beam path of the individual particle beams.

16. The particle beam system of claim 1, wherein:
the individual opening in the first aperture plate comprises a midpoint that coincides with an optical axis of the particle beam system; and
the multi-aperture plate is downstream of the first aperture plate along the beam path of the individual particle beams.

17. The particle beam system of claim 1, wherein:
the individual opening in the first aperture plate comprises a midpoint that coincides with an optical axis of the particle beam system;
the multi-deflector array further comprises:
a magnetically conductive second aperture plate comprising an individual opening, the second aperture plate being in the beam path of the individual particle beams so that the individual particle beams substantially pass through the individual opening of the second aperture plate; and
a second coil configured to generate a magnetic field,
the multi-aperture plate and the second aperture plate are connected to each other to define a second cavity therebetween;
the second coil is in the second cavity so that the individual particle beams substantially pass through the second coil; and
a winding direction of the second coil runs counter to a winding direction of the first coil.

18. The particle beam system of claim 1, wherein:
the individual opening in the first aperture plate comprises a midpoint that coincides with an optical axis of the particle beam system; and
at least one of the following holds:
a magnetic permeability of at least one plate selected from the group consisting of the multi-aperture plate and the first aperture plate is at least 500; and
a magnetically conductive coating of at least one plate selected from the group consisting of the multi-aperture plate and the first aperture plate has a magnetic permeability of at least 500.

19. The particle beam system of claim 1, wherein:
the individual opening in the first aperture plate comprises a midpoint that coincides with an optical axis of the particle beam system; and
at least one plate selected from the group consisting of the multi-aperture plate and the first aperture plate comprises at least one material selected from the group consisting of iron, nickel, cobalt, ferrite, mu-metal, and nanocrystalline metal.

20. The particle beam system of claim 1, wherein:
the individual opening in the first aperture plate comprises a midpoint that coincides with an optical axis of the particle beam system; and
at least one plate selected from the group consisting of the multi-aperture plate and the first aperture plate has a thickness of at least 30 μm.

21. The particle beam system of claim 1, wherein:
the individual opening in the first aperture plate comprises a midpoint that coincides with an optical axis of the particle beam system; and
at least one plate selected from the group consisting of the multi-aperture plate and the first aperture plate comprises a coating having a thickness of at least 30 μm.

22. The particle beam system of claim 1, wherein:
the individual opening in the first aperture plate comprises a midpoint that coincides with an optical axis of the particle beam system; and
at least one of the following holds:
the openings of the multi-aperture plate are circular; and
the individual opening of the first aperture plate is circular.

23. The particle beam system of claim 1, wherein:
the multi-beam particle source comprises a particle source and a first multi-aperture arrangement;
the particle source is configured to generate a diverging beam of charged particles that impinges on the first multi-aperture plate to generate the multiplicity of charged individual particle beams.

24. The particle beam system of claim 1, further comprising:
an objective lens; and
a detector,
wherein the particle beam system is configured so that, after passing through the magnetic multi-deflector array, the individual particle beams impinge on an object in an object plane of the particle beam system to produce interaction products that pass through the objective lens and impinge on the detector.

25. The particle beam system of claim 1, further comprising:
an objective lens configured to focus the individual particle beams onto an object in an object plane of the particle beam system; and
a detection system configured to detect interaction products generated when the individual particle beams impinge on the object; and
a beam switch,
wherein:
the beam switch is between the multi-beam particle source and the objective lens along a path of the individual particle beams; and the beam switch is between the objective lens and the detector along a path of the interaction products.

* * * * *